(12) United States Patent
Kim et al.

(10) Patent No.: US 8,685,770 B2
(45) Date of Patent: Apr. 1, 2014

(54) THIN FILM TRANSISTOR ARRAY PANEL AND METHOD FOR MANUFACTURING THE SAME

(75) Inventors: Dae-Cheol Kim, Suwon-si (KR); Woong-Kwon Kim, Cheonan-si (KR); Sang-Youn Han, Seoul (KR)

(73) Assignee: Samsung Display Co., Ltd. (KR)

( * ) Notice: Subject to any disclaimer, the term of this patent is extended or adjusted under 35 U.S.C. 154(b) by 245 days.

(21) Appl. No.: 12/904,281

(22) Filed: Oct. 14, 2010

(65) Prior Publication Data

US 2011/0095300 A1 Apr. 28, 2011

(30) Foreign Application Priority Data

Oct. 28, 2009 (KR) .................. 10-2009-0102977

(51) Int. Cl.
*H01L 21/00* (2006.01)
(52) U.S. Cl.
USPC .................. 438/30; 257/72; 257/E25.02
(58) Field of Classification Search
USPC .......... 438/30, 151; 257/72, E25.02, E21.411
See application file for complete search history.

(56) References Cited

U.S. PATENT DOCUMENTS

| 7,405,428 B2 | 7/2008 | Yun | |
|---|---|---|---|
| 2007/0057260 A1* | 3/2007 | Lee | 257/72 |
| 2010/0009481 A1* | 1/2010 | Tseng et al. | 438/34 |

FOREIGN PATENT DOCUMENTS

| JP | 2003-279945 A | 10/2003 |
|---|---|---|
| JP | 2003-279967 A | 10/2003 |
| JP | 2007-293153 A | 11/2007 |
| JP | 2008-052213 A | 3/2008 |
| JP | 2008-165234 A | 7/2008 |
| KR | 1020060124850 A | 12/2006 |
| KR | 1020070002555 A | 1/2007 |
| KR | 1020070029421 A | 3/2007 |
| KR | 1020070030403 A | 3/2007 |
| KR | 1020080087288 A | 10/2008 |

OTHER PUBLICATIONS

Translation of KR 1020060124850A, Hong-Sik Kim, pp. 1-47.*

* cited by examiner

*Primary Examiner* — Shaun Campbell
(74) *Attorney, Agent, or Firm* — Cantor Colburn LLP

(57) ABSTRACT

A manufacturing method of a thin film transistor array panel includes forming a gate line on a substrate and a gate insulating layer on the gate line, forming a semiconductor on the gate insulating layer, forming a first data line and a first drain electrode on the semiconductor, forming a lower passivation layer on the first data line and the first drain electrode, forming an upper passivation layer on the lower passivation layer and a metal layer on the upper passivation layer, etching the metal layer by using a photosensitive film as a mask to form a reflecting electrode and to expose the lower passivation layer, etching the exposed lower passivation layer to form a first contact hole exposing the first drain electrode, and forming a connection assistance member connecting the first drain electrode and the reflecting electrode through the first contact hole after removing the photosensitive film.

11 Claims, 13 Drawing Sheets

THIN FILM TRANSISTOR ARRAY PANEL AND METHOD FOR MANUFACTURING THE SAME

This application claims priority to Korean Patent Application No. 10-2009-0102977 filed on Oct. 28, 2009, and all the benefits accruing therefrom under 35 U.S.C. §119, the entire contents of which are incorporated herein by reference.

BACKGROUND OF THE INVENTION (a) Field of the Invention

The invention relates to a thin film transistor array panel and a manufacturing method thereof.

(b) Description of the Related Art

A liquid crystal display ("LCD") includes two display panels in which field generating electrodes such as pixel electrodes and a common electrode are formed, and a liquid crystal layer that is interposed therebetween. The liquid crystal display generates an electric field in the liquid crystal layer by applying a voltage to the field generating electrodes, thereby determining the direction of liquid crystal molecules of the liquid crystal layer and displaying images by controlling the transmittance of light.

However, because the liquid crystal display is a non-emissive device, a light source is required. The LCD may be classified as a transmissive type and a reflective type depending on the type of light source.

In the liquid crystal display of the transmissive type, light emitted from a backlight as a light source that is attached to a rear surface of a liquid crystal panel is incident to the liquid crystal layer, such that light transmittance is controlled according to an arrangement of liquid crystal molecules to display images. In the liquid crystal display of the reflective type, natural external light or artificial light is reflected, and the light transmittance is controlled according to arrangement of the liquid crystal molecules.

The transmissive type of liquid crystal display generates bright images that can be displayed in a dark environment since it uses a rear light source, but it has high power consumption. The reflective type of liquid crystal display consumes little power in comparison with the transmissive type since it depends on external natural light or external artificial light, but it is difficult to use in a dark environment.

Accordingly, a transflective type of liquid crystal display that can appropriately select a reflection mode and a transmissive mode according to the circumference has been suggested.

However, a following process is executed in the state that a reflecting electrode of a liquid crystal display is exposed after forming the reflecting electrode, such that the surface of the reflecting electrode may be damaged during the following process.

BRIEF SUMMARY OF THE INVENTION

Exemplary embodiments of the invention prevent damage to the surface of the reflecting electrode.

An exemplary embodiment of a manufacturing method of a thin film transistor array panel according to the invention includes forming a gate line on a substrate, forming a gate insulating layer on the gate line, forming a semiconductor on the gate insulating layer, forming a first data line and a first drain electrode on the semiconductor, forming a lower passivation layer on the first data line and the first drain electrode, forming an upper passivation layer including protrusions and depressions and a preliminary contact hole on the lower passivation layer, forming a metal layer on the upper passivation layer, forming a photosensitive film on the metal layer, etching the metal layer by using the photosensitive film as an etching mask to form a reflecting electrode, and to expose the lower passivation layer through the preliminary contact hole, etching the exposed lower passivation layer through the preliminary contact hole to form a first contact hole exposing the first drain electrode, and forming a connection assistance member connecting the first drain electrode and the reflecting electrode to each other through the first contact hole after removing the photosensitive film.

After the forming a metal layer, the upper passivation layer may be disposed between the metal layer and the lower passivation layer, and the reflecting electrode may be formed only by the etching the metal layer.

After the forming a metal layer, the upper passivation layer may be disposed between the metal layer and the lower passivation layer, and in the etching the exposed lower passivation layer, the upper passivation layer may not be etched and only the lower passivation layer may be etched.

A storage electrode line may be formed on the substrate in the forming of the gate line, an opening exposing the lower passivation layer on the storage electrode line may be formed in the forming of the upper passivation layer, and the reflecting electrode may be connected with the exposed lower passivation layer through the opening.

The metal layer may be wet-etched, and the lower passivation layer may be dry-etched.

The metal layer may be over-etched in the etching of the metal layer to form an undercut under the photosensitive film.

The undercut may be formed within a depth of about 3 micrometers (μm).

The forming of the upper passivation layer may include coating a photosensitive organic layer on the lower passivation layer, and exposing the photosensitive organic layer by using a photomask including a transmission region, a translucent region, and a light blocking region.

The translucent region may be formed of a semi-transparent layer including slits, and the translucent region may be disposed on a portion where the reflecting electrode is positioned in the exposing using the photomask.

The translucent region of the photomask may include a first translucent region and a second translucent region having different light transmittance, and in the exposing through the photomask, the first translucent region may be disposed on a portion where the reflecting electrode will be formed and the second translucent region may be disposed on the circumference of the ends of the gate line or the data line.

A second data line and a second drain electrode may be further formed in the forming of the first data line and the first drain electrode, a second contact hole exposing the second drain electrode may be formed in the forming of the first contact hole, and a transmitting electrode connected to the second drain electrode through the second contact hole on the upper passivation layer may be formed in the forming of the connection assistance member.

The semiconductor, the first and second data lines, and the first and second drain electrodes may be formed by using a photosensitive film pattern having different thickness depending on positions.

An exemplary embodiment of a thin film transistor array panel includes a gate line and a first storage electrode line disposed on a substrate, a first data line insulated from and intersecting the gate line and the first storage electrode line, a first thin film transistor connected to the gate line and the first data line, a lower passivation layer and an upper passivation layer disposed on the first thin film transistor and including a first contact hole exposing the first drain electrode of the first thin film transistor, a reflecting electrode disposed on the upper passivation layer, and a connection assistance member disposed at the first contact hole and connecting the first drain electrode and the reflecting electrode. The upper passivation layer includes a first opening exposing the lower passivation layer overlapping the first storage electrode line, and the reflecting electrode is connected with the lower passivation layer through the first opening.

A transmitting electrode disposed on the upper passivation layer may be further included, and the connection assistance member may include a same material as the transmitting electrode.

A second data line intersecting the gate line and the first storage electrode line and a second thin film transistor connected to the gate line and the second data line may be further included, the upper passivation layer and the lower passivation layer may include a second contact hole exposing the second drain electrode of the second thin film transistor, and the transmitting electrode may be connected to the second drain electrode through the second contact hole.

The transmitting electrode may include a domain division member.

A second storage electrode line overlapping the transmitting electrode may be further included.

The first contact hole may overlap the first storage electrode line, and the second contact hole may overlap the second storage electrode line.

The upper passivation layer may include a protrusion and depression portion where protrusions and depressions are disposed, and the reflecting electrode may be disposed on the protrusion and depression portion.

The ends of the gate line and the data line may have an expanded width to receive an external signal, the upper passivation layer may include second and third contact holes respectively exposing the ends of the gate line and the data line, and the upper passivation layer near the second and third contact holes may be thinner than the upper passivation layer under the transmitting electrode.

According to exemplary embodiments of the invention, the surface of the reflecting electrode is not damaged.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION OF THE INVENTION

Figure 1:
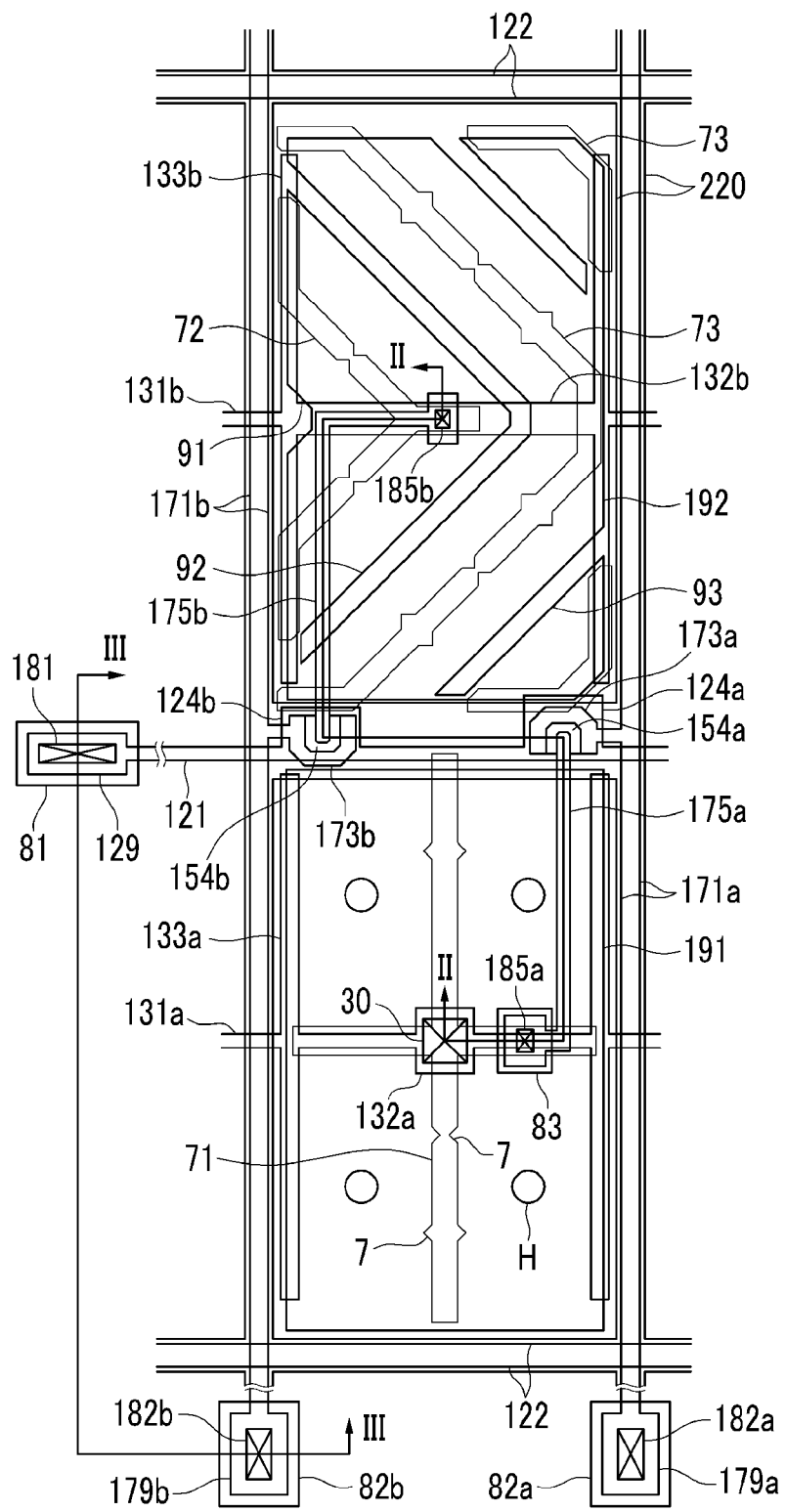
FIG. 1 is an exemplary embodiment of a plan view of a liquid crystal display according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower", "under," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "upper" relative to the other elements or features. Thus, the exemplary term "lower" and "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

Figure 2:
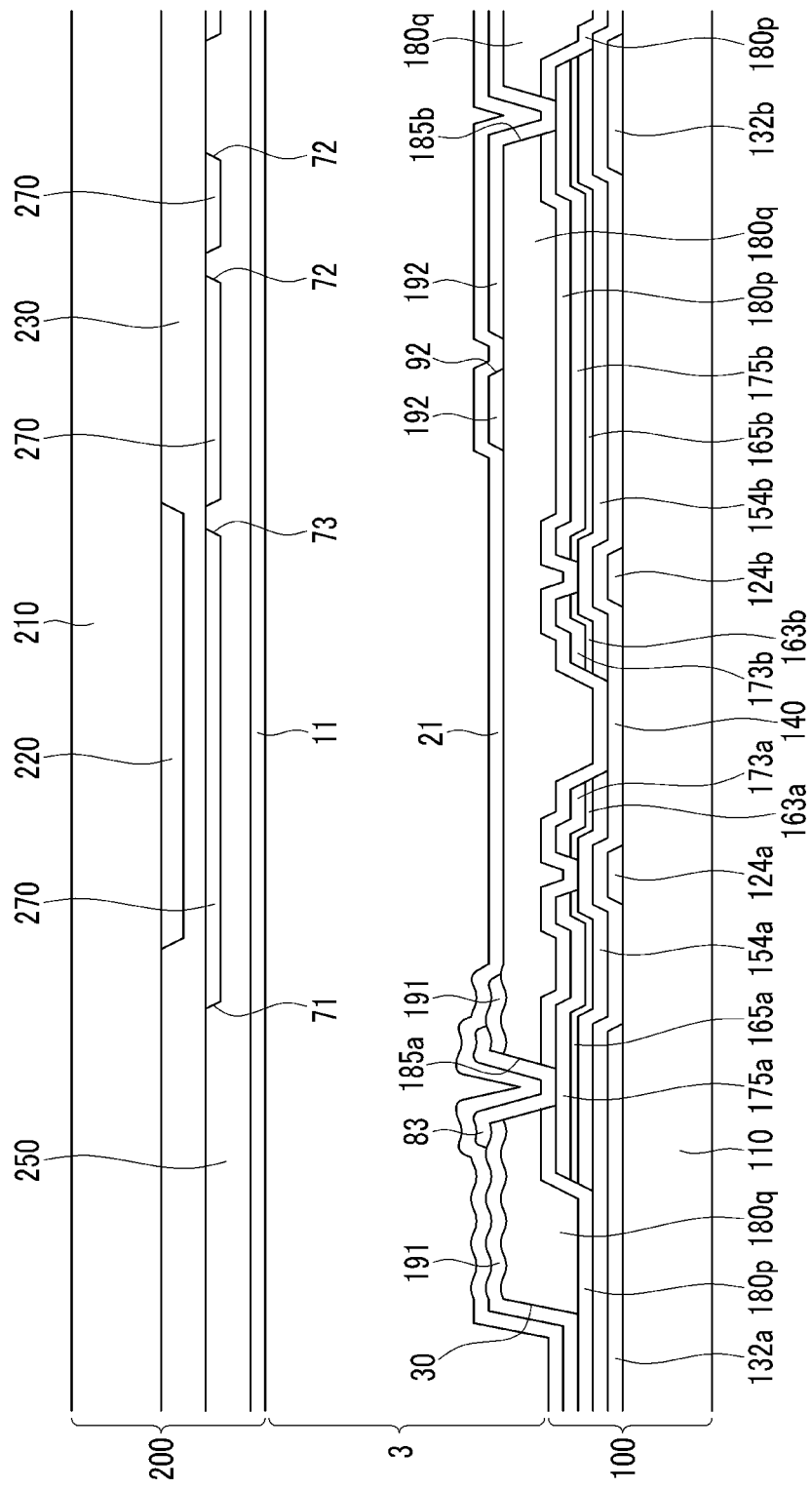
FIG. 2 is a cross-sectional view of the liquid crystal display shown in FIG. 1 taken along line II-II.
Figure 3:
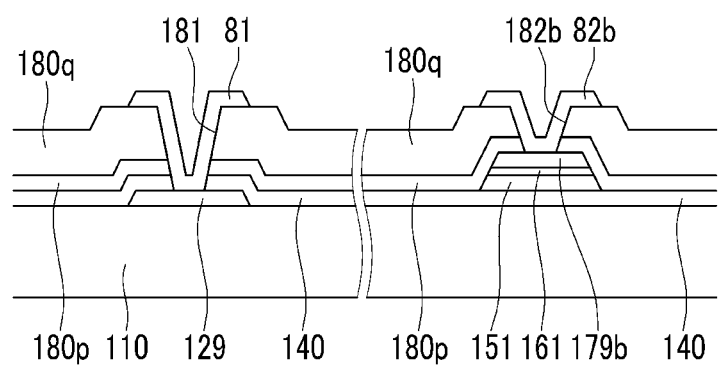
FIG. 3 is a cross-sectional view of the liquid crystal display shown in FIG. 1 taken along line III-III.

FIG. 1 is a plan view of an exemplary embodiment of a liquid crystal display according to the invention, FIG. 2 is a cross-sectional view of the liquid crystal display shown in FIG. 1 taken along line II-II, and FIG. 3 is a cross-sectional view of the liquid crystal display shown in FIG. 1 taken along line III-III.

Referring to FIG. 1 through FIG. 3, a liquid crystal display according to the illustrated exemplary embodiment includes a thin film transistor array panel 100 and a common electrode panel 200 that face each other, and a liquid crystal layer 3 interposed therebetween.

The thin film transistor array panel 100 will now be described.

A gate line 121, a storage electrode line 131a, a storage electrode line 131b, and a light blocking metal pattern 122 are disposed an insulation substrate 110. In exemplary embodiments, a plurality of the gate line 121, a plurality of the storage electrode lines 131a and 131b, and a plurality of the light blocking metal pattern 122 are disposed an insulation substrate 110.

The gate lines 121 transmit gate signals and extend in a transverse direction. Each gate line 121 includes a plurality of a first gate electrode 124a and a plurality of a second gate electrode 124b protruding upward in the plan view, from a main portion of the gate line 121. An end 129 of the gate line 121 may have a wide width relative to the main portion of the gate line 121, the width taken in the transverse direction and/or a longitudinal direction substantially perpendicular to the transverse direction, for connection with other layers.

The storage electrode lines 131a and 131b extend substantially parallel to the gate lines 121, and include a plurality of a storage electrode 133a and 133b, protruded in upward and downward directions in the plan view from a main portion of the storage electrode lines 131a and 131b, respectively. Also, the storage electrode lines 131a and 131b include an expansion 132a and 132b, respectively, having a wider width than remaining portions of the storage electrode lines 131a and 131b. However, the planar shapes and arrangements of the storage electrode lines 131a and 131b may be modified in various forms.

The light blocking metal pattern 122 longitudinally extends substantially parallel to the storage electrode lines 131a and 131b, and is disposed between neighboring pixels, thereby reducing or effectively preventing light leakage.

A gate insulating layer 140 is disposed on the gate line 121 and the storage electrode lines 131a and 131b, and semiconductors 151, 154a, and 154b, preferably including amorphous or crystallized silicon, are disposed on the gate insulating layer 140. In exemplary embodiments, a plurality of the semiconductors 151, 154a, and 154b are disposed on the gate insulating layer 140.

A plurality of ohmic contact 161, as well as 163a and 165a, and 163b and 165b disposed in pairs, are disposed on the semiconductors 151, 154a, and 154b, respectively. The ohmic contacts 161, 163a, 163b, 165a, and 165b may include a material such as n+ hydrogenated amorphous silicon in which an n-type impurity is doped with a high concentration, or of a silicide.

A plurality of a pair of data lines 171a and 171b and a plurality of a pair of first and second drain electrodes 175a and 175b are disposed on the ohmic contacts 161, 163a, 163b, 165a, and 165b, and on the gate insulating layer 140, respectively.

The data lines 171a and 171b transmit data signals, extend substantially in the longitudinal direction, and cross the gate lines 121 and the storage electrode lines 131a and 131b.

The data lines 171a and 171b include a first source electrode 173a and a second source electrode 173b, extending toward the first gate electrode 124a and the second gate electrode 124b, respectively, and curved with a "U" shape in the plan view. The first source electrode 173a and the second source electrode 173b are disposed opposite to the first drain electrode 175a and the second drain electrode 175b, with respect to the first gate electrode 124a and the second gate electrode 124b, respectively.

Each first drain electrode 175a includes a first end partially enclosed by the first source electrode 173a and extended downward in the plan view, and a second end opposing the first end, overlapping the expansion 132a of the storage electrode line 131a and having a wide area for connection to another layer. Each second drain electrode 175b includes a first end partially enclosed by the second source electrode 173b and extended downward, and a second end opposing the first end, overlapping the expansion 132b of the storage electrode line 131b and having a wide area for connection to another layer.

However, the shapes and arrangement of the first and second drain electrodes 175a and 175b, and the data lines 171a and 171b may be modified in various forms.

The first gate electrode 124a and the second gate electrode 124b, the first source electrode 173a and the second source electrode 173b, and the first drain electrode 175a and the second drain electrode 175b respectively form the first thin film transistor ("TFT") Qa and the second TFT Qb, along with the first semiconductor 154a and the second semiconductor 154b. The channels of the first TFT Qa and the second TFT Qb are respectively disposed on the first semiconductor 154a and the second semiconductor 154b between the first source electrode 173a and the first drain electrode 175a, and the second source electrode 173b and the second drain electrode 175b.

The ohmic contacts 161, 163a and 165a, and 163b and 165b are respectively interposed only between the underlying semiconductors 151, 154a, and 154b, and an overlying end portion 179b of data line 171b, the overlying data lines 171a and 171b, and the overlying first and second drain electrodes 175a and 175b, and reduce contact resistance between them. The ohmic contacts 161, 163a and 165a, and 163b and 165b respectively have the same plane shape (e.g., upper planar surface) as the end portion 179b, the data lines 171a and 171b, and the drain electrodes 175a and 175b.

The semiconductors 154a and 154b including a first portion that is exposed without being covered by the data lines 171a and 171b, and the drain electrodes 175a and 175b, and a second portion disposed between and overlapped by the first and second source electrodes 173a and 173b, and the first and second drain electrodes 175a and 175b. The exposed first portions form a channel of the thin film transistor, and the second portions of the semiconductors 151, 154a, and 154b (e.g., except for the channel) have the same plane shape as the ohmic contacts 161, 163a and 165a, and 163b and 165b.

A lower passivation layer 180p, preferably including silicon nitride or silicon oxide, is disposed on the data lines 171a and 171b, the first and second drain electrodes 175a and 175b, and the exposed first portions of the semiconductors 154a and 154b.

An upper passivation layer 180q, including an organic material, having varying thicknesses, and including an opening 30 and contact holes 181, 182a, 182b, 185a, and 185b, is disposed directly on and contacting the lower passivation layer 180p. In an exemplary embodiment, the surface of the upper passivation layer 180q may include protrusions and depressions, and the protrusions and depressions may have a concave mirror shape or a non-symmetrical shape. The opening 30 and the contact holes 181, 182a, 182b, 185a, and 185b may be considered an enclosed opening respectively penetrating the upper passivation layer 180q and/or the lower passivation layer 180p, such that that upper passivation layer 180q and/or the lower passivation layer 180p solely defines the enclosed opening 30 and contact holes 181, 182a, 182b, 185a, and 185b.

The opening 30 in the upper passivation layer 180q exposes the lower passivation layer 180p, or the gate insulating layer 140 disposed on and overlapping the expansion 132a of the storage electrode line 131a.

A reflecting electrode 191, a transmitting electrode 192, a connection assistance member 83, and contact assistants 81, 82a, and 82b are disposed directly on the upper passivation layer 180q. The reflecting electrode 191 and the transmitting electrode 192 may collectively be referred to as a pixel electrode.

The reflecting electrode 191 is electrically connected with the lower passivation layer 180p through the opening 30, and includes a cross-sectional profile that is curved according to the protrusions and depressions of the upper passivation layer 180q. The reflecting electrode 191 may include a single layer or a double layer of an aluminum-based metal, such as aluminum or an aluminum-neodymium alloy ("AlNd").

The transmitting electrode 192, the connection assistance member 83, and the contact assistants 81, 82a, and 82b may include a transparent conductive material, such as indium tin oxide ("ITO") or indium zinc oxide ("IZO").

In a plan view, the transmitting electrode 192 has four major edges, and is a quadrangle that is chamfered at the right corner. The chamfered edge of the transmitting electrode 192 forms an angle of about 45° with respect to the four major edges.

The transmitting electrode 192 includes a central cutout 91, a first oblique cutout 92, and a plurality of a second oblique cutout 93. In the plan view, the transmitting electrode 192 is divided into a plurality of regions by the cutouts 91, 92, and 93. The cutouts 91, 92, and 93 have inversion symmetry with respect to an imaginary transverse line bisecting the transmitting electrode 192 in the transverse direction.

The first oblique cutout 92 is approximately obliquely inclined from a left major edge of the transmitting electrode 192 to a right major edge, and includes portions that are respectively disposed on the lower-half portion and the upper-half portion with respect to the transverse central line of the transmitting electrode 192. The second oblique cutouts 93 are approximately obliquely inclined from an upper major edge of the transmitting electrode 192 to the right major edge, and from the right major edge of the transmitting electrode 192 to a lower major edge of the transmitting electrode 192, and are respectively disposed on the lower-half portion and the upper-half portion with respect to the transverse central line of the transmitting electrode 192.

The first and second oblique cutouts 92 and 93 are inclined with respect to the transverse central line of the transmitting electrode 192 by an angle of about 45°, and extend substantially perpendicular to each other.

Accordingly, the lower half and the upper half of the transmitting electrode 192 are partitioned into three partitions by the cutouts 92 and 93. The number of partitions and the number of cutouts can be varied depending on design factors such as the size of the transmitting electrode 192, the ratio of the transverse edges and the longitudinal edges of the transmitting electrode 192, the type and characteristics of the liquid crystal layer 3, and so on.

The transmitting electrode 192 is physically and electrically connected to the second drain electrode 175b through the contact hole 185b, thereby receiving a data voltage from the second drain electrode 175b.

The connection assistance member 83 is physically and electrically connected to the first drain electrode 175a through the contact hole 185a, thereby receiving the data voltage from the first drain electrode 175a and transmitting the data voltage to the reflecting electrode 191.

The reflecting electrode 191 and the transmitting electrode 192 that are supplied with a data voltage generate an electric field in cooperation with a common electrode 270 disposed on the common electrode panel 200 supplied with a common voltage, so that the orientations of the liquid crystal molecules in the liquid crystal layer 3 interposed between the electrodes 191 and 192, and 270, are determined. In accordance with the determined orientations of the liquid crystal molecules, the polarization of light passing through the liquid crystal layer 3 is varied. The reflecting electrode 191 and transmitting electrode 192, and the common electrode 270, collectively form a capacitor (hereinafter referred to as "a liquid crystal capacitor") to maintain the applied voltage even after the TFT is turned off.

The transflective liquid crystal display including the thin film transistor array panel 100, the common electrode panel 200, and the liquid crystal layer 3 may be divided into a transmitting region ("TA") and a reflecting region ("RA") defined by the reflecting electrode 191 and the transmitting electrode 192, respectively.

At the transmitting region TA, light made incident to the rear side of the liquid crystal display, that is, directly to the thin film transistor array panel 100, transmits through the liquid crystal layer 3 and then comes out to a front surface of the liquid crystal display, that is, out of the color filter display panel 200, to thereby perform displaying of images. At the reflecting region RA, light coming from the front surface proceeds into the light crystal layer 3 and is then reflected by the reflecting electrode 191 to transmit again through the liquid crystal layer 3, so as to be emanated to the front surface, to thereby perform displaying of images. In an exemplary embodiment, the transmitting region TA may be an area where only the transmitting electrode 192 is disposed, and the reflecting region RA may be an area where only the reflecting electrode 191 is disposed.

Although not shown, a thickness of the liquid crystal layer 3 and/or the cell gap at the transmitting region TA, may be different from the reflecting region RA. In one exemplary embodiment, the cell gap of the transmitting region TA may be two times the cell gap of the reflecting region RA. The cell gap may be defined as a distance between a lowermost surface of the common electrode panel 200 and an uppermost surface of the TFT array panel 100.

The first and second drain electrodes 175a and 175b electrically connected to the reflecting electrode 191 and the transmitting electrode 192, respectively overlap the storage electrode lines 131a and 131b. A capacitor formed as the reflecting electrode 191 and the transmitting electrode 192, and the first and second drain electrodes 175a and 175b electrically connected thereto, overlap with the storage electrode lines 131a and 131b, is called a storage capacitor that strengthens capability of voltage storage of the liquid crystal capacitor.

The contact assistants 81, 82a, and 82b are physically and electrically connected with the end portion 129 of the gate line 121, and end portions 179a and 179b of the data lines 171a and 171b, through the contact holes 181, 182a, and 182b, respectively. The contact assistants 81, 82a, and 82b effectively cover (e.g., overlap) an entire of the exposed surfaces of the end portion 129 of the gate line 121, the end portions 179a and 179b of the data lines 171a and 171b, the lower and upper passivation layers 180p and 180q and the gate insulating layer 140 exposed in the contact holes 181, 182a and 182b, respectively. The contact assistants 81, 82a, and 82b complement bonding characteristics of the end portion 129 of the gate line 121, and the end portions 179a and 179b of the data lines 171a and 171b, with an external device, and protect the respective end portions. In an exemplary embodiment, the contact assistants 81, 82a, and 82b may be disposed in the same layer, and may include a same material as the transmitting electrode 192.

Next, the common electrode panel 200 will be described.

A light blocking member 220 is disposed on a substrate 210 including an insulation material, for example, transparent glass or plastic. The light blocking member 220 is also referred to as a black matrix, defines a plurality of an opening corresponding to the reflecting electrode 191 and the transmitting electrode 192, and reduces or effectively prevents light from leaking between the pixels.

A plurality of a color filter 230 is disposed on the substrate 210, and are substantially positioned inside the openings defined and surrounded by the light blocking member 220. The color filters 230 may longitudinally extend along the longitudinal direction along a column direction of the pixel electrodes 191 and 192, thereby forming a substantially stripe shape. In an exemplary embodiment, each color filter 230 may display one of the primary colors, e.g., red, green, or blue.

The color filter 230 of the reflecting region RA includes a plurality of through holes H (FIG. 1). The through holes H reduce a difference of color reproducibility between the transmitting region TA and the reflecting region RA that is generated due to differences of the light paths. Alternatively, the difference of the color reproducibility may be reduced by varying the thickness of the color filter 230 depending on position within the liquid crystal display.

The common electrode 270 is disposed directly on and overlapping portions of the color filter 230 and the light blocking member 220. In an exemplary embodiment, the common electrode 270 preferably includes a transparent conductor, such as ITO or IZO.

The common electrode 270 includes a cutout 71 disposed in the reflecting region RA, and cutouts 72 and 73 disposed in the transmitting region TA.

In the plan view, the cutout 71 disposed in the reflecting region RA includes portions extending in the transverse and longitudinal directions, thereby dividing the reflecting region RA into four regions.

In the plan view, the cutouts 72 and 73 disposed in the transmitting region TA are disposed between the cutouts 91, 92, and 93 of the transmitting electrode 192, or between the cutouts 91, 92, and 93 and the chamfered edge of the transmitting electrode 192.

The cutouts 72 and 73 respectively include at least one oblique portion disposed parallel to the oblique cutouts 92 and 93 of the transmitting electrode 192, in the plan view. Ends of the oblique portions of the cutouts 72 and 73 respectively include a longitudinal portion and a transverse portion extending according to the edges of the transmitting electrode 192 and overlapping the edges of the edges of the transmitting electrode 192. The transverse and longitudinal portions of the oblique portions of the cutouts 72 and 73 form an obtuse angle with the respective oblique portion.

One of the oblique portions of the cutout 72 may include a central transverse portion extending aligned with the transverse central line of the transmitting electrode 192. The central transverse portion of the cutout 72 may overlap the expansion 132b of the storage electrode line 131b, in the plan view.

Also, each oblique portion of the cutouts 72 and 73 includes a plurality of a notch 7, that are concave or convex with respect to an edge of the oblique portion. A portion of the cutout 71 of the common electrode 270 may also include a plurality of a notch 7, that are concave or convex with respect to an edge of the cutout 71. The notches 7 determine the inclination direction of the liquid crystal molecules positioned overlapping the cutouts 71, 72 and 73. In an exemplary embodiment, the notches 7 may be disposed at the cutouts 91, 92, and 93 of the transmitting electrode 192.

An overcoat member 250 may be disposed on the color filter 230, the light blocking member 220, and the common electrode 270 of the common electrode panel 200. The overcoat member 250 may include an (organic) insulator. The overcoat member 250 protects the color filters 230 to prevent the color filters 230 from being exposed, and also provides a flat (e.g., planar) surface of the common electrode panel 200.

Alignment layers 11 and 21 are disposed on innermost sides of the TFT array display panel 100 and the common electrode display panel 200 to align the liquid crystal layer 3. At least one polarizer (not shown) may be disposed at outermost sides of the TFT array display panel 100 and the common electrode display panel 200.

The liquid crystal layer 3 is aligned vertically or horizontally.

In an exemplary embodiment, the liquid crystal display further includes a plurality of elastic spacers (not shown) for maintaining an interval between the thin film transistor array panel 100 and the common electrode panel 200.

In an exemplary embodiment, the liquid crystal display may further include a sealant (not shown) for combining the thin film transistor array panel 100 and the common electrode panel 200. The sealant is positioned on and overlapping a (peripheral) edge of the common electrode panel 200.

Next, an exemplary embodiment of a manufacturing method of a thin film transistor array panel of the liquid crystal display shown in FIG. 1 through FIG. 3 according to the invention will be described with reference to FIG. 4 through FIG. 13, with reference to FIG. 2 and FIG. 3.

FIG. 4 through FIG. 13 are cross-sectional views sequentially showing an exemplary embodiment of a manufacturing method of a thin film transistor array panel according to the invention, taken along lines II-II and III-III of FIG. 1, respectively.

Figure 4:
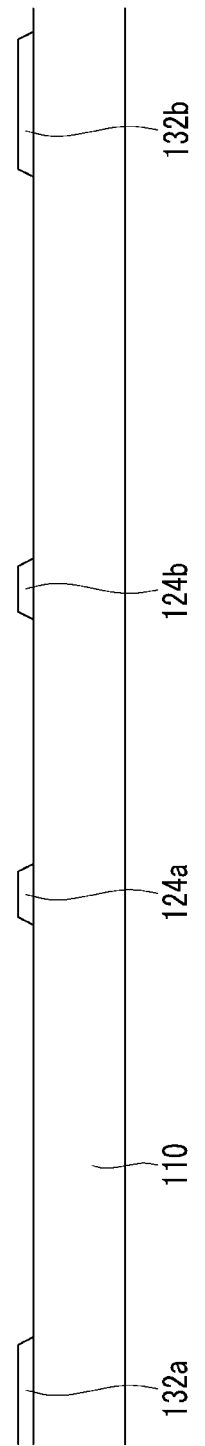
FIG. 4 through 13 are cross-sectional views sequentially showing an exemplary embodiment of a manufacturing method of a thin film transistor array panel according to the invention, and taken along lines II-II and III-III of FIG. 1, respectively.
Figure 5:
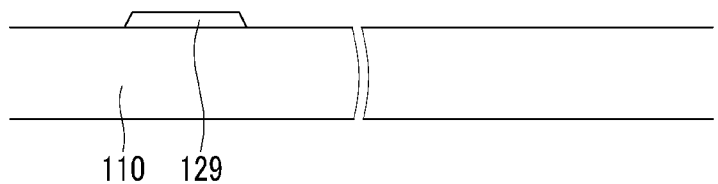

As shown in FIG. 4 and FIG. 5, a first metal layer is deposited directly on an upper surface of an insulation substrate 110 including transparent glass or plastic, and is patterned to form a gate line including an end portion 129, first gate electrode 124a and second gate electrode 124b, and a storage electrode line including storage electrodes and storage electrode expansions 132a and 132b.

Figure 6:
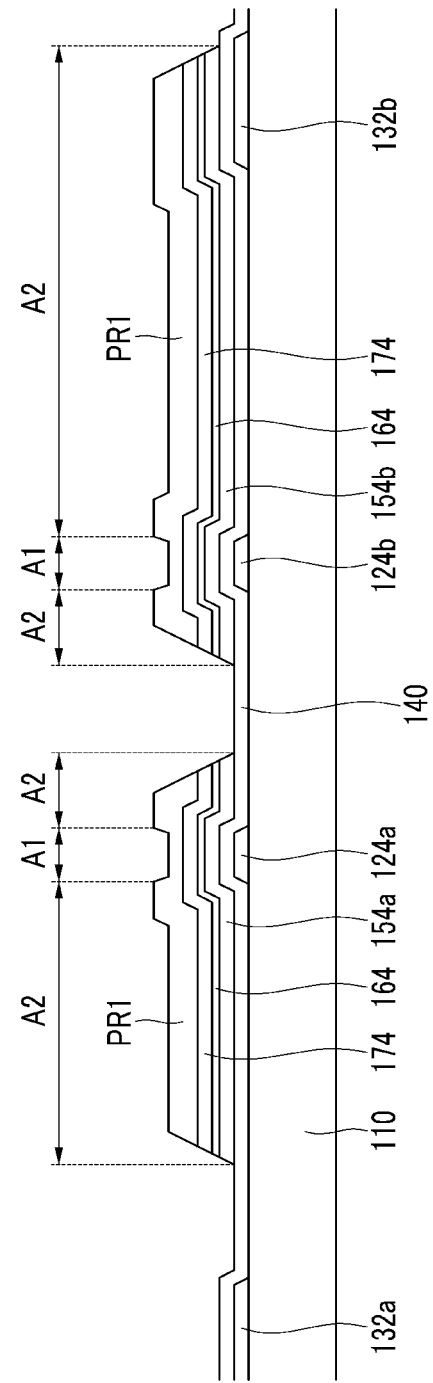
Figure 7:
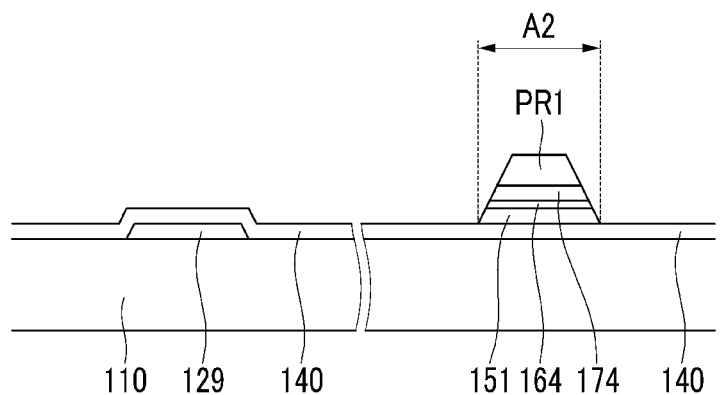

As shown in FIG. 6 and FIG. 7, a gate insulating layer 140, an amorphous silicon layer, a doped amorphous silicon layer, and a second metal layer are sequentially deposited on the substrate 110 including the gate line and the storage electrode.

A first photosensitive film PR1 having different thicknesses depending on a position on the substrate 110, is formed directly on the second metal layer. First portions of the amorphous silicon layer, the doped amorphous silicon layer, and the second metal layer corresponding to a channel of a TFT are referred to as a first region A1, and second portions of the amorphous silicon layer, the doped amorphous silicon layer, and the second metal layer corresponding to the wires, such as the drain electrode and the data line, are referred to as a second region A2.

There may be various methods for forming the photosensitive pattern (e.g., first photosensitive film PR1) such that portions thereof have different thicknesses according to a position on the substrate, for example, using an exposure mask including a transparent area, a light blocking area, and a semi-transparent area. The semi-transparent area includes a slit pattern, a lattice pattern, or a thin film having median transmittance or having a median thickness. When the slit pattern is used, the width of the slits or the space between the slits is preferably smaller than the resolution of a light exposer used for photolithography.

Another exemplary embodiment of the method includes using a reflowable photosensitive film. The method using a reflowable photosensitive film forms a thin portion by making a photosensitive film flow into a region where the photosensitive film is not present, after forming the reflowable photosensitive film with a general exposure mask having only a light transmitting area and a light blocking area.

Referring again to FIG. 6 and FIG. 7, the second metal layer, the doped amorphous silicon layer, and the amorphous silicon layer are etched by using the first photosensitive film PR1 as an etching mask, to form a conductor pattern 174, an ohmic contact layer pattern 164, and semiconductors 151, 154a, and 154b.

Figure 8:
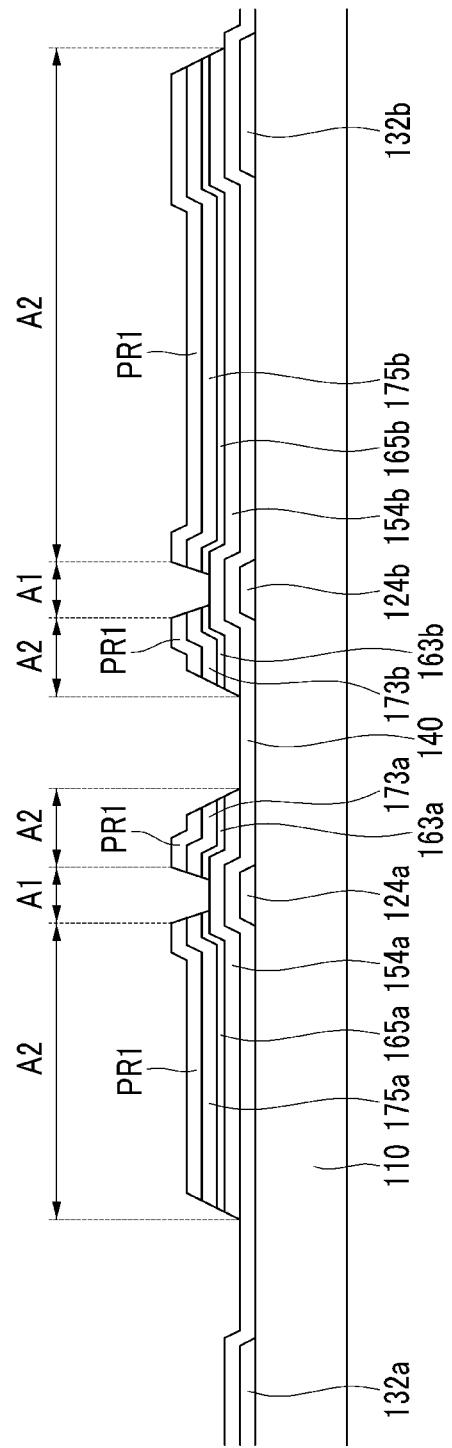
Figure 9:
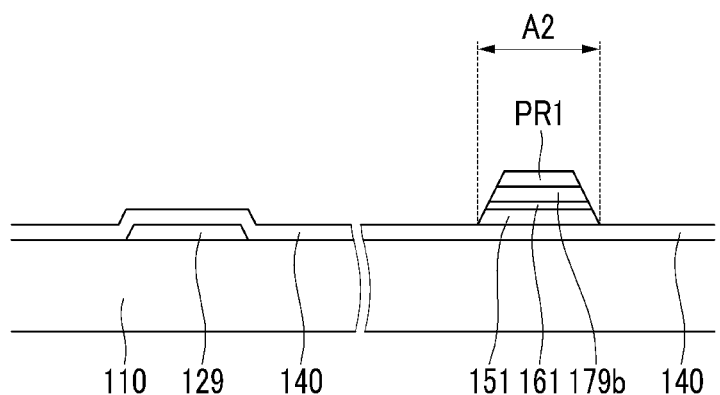

As shown in FIG. 8 and FIG. 9, after the first photosensitive film PR1 of the first portion A1 is effectively completely removed, such as through an etch-back process, a portion of the first photosensitive film PR1 remains in the second regions A2, the remaining portions having a thickness smaller than an original thickness shown in FIG. 6 and FIG. 7. The conductor pattern 174 and the ohmic contact layer pattern 164 are etched by using the remaining first photosensitive film PR1 of the second portion A2 as the etching mask, to form a data line including an end portion 179b and first and second source electrodes 173a and 173b, first and second drain electrodes 175a and 175b, and ohmic contact layers 161, 163a, 163b, 165a, and 165b.

Figure 10:
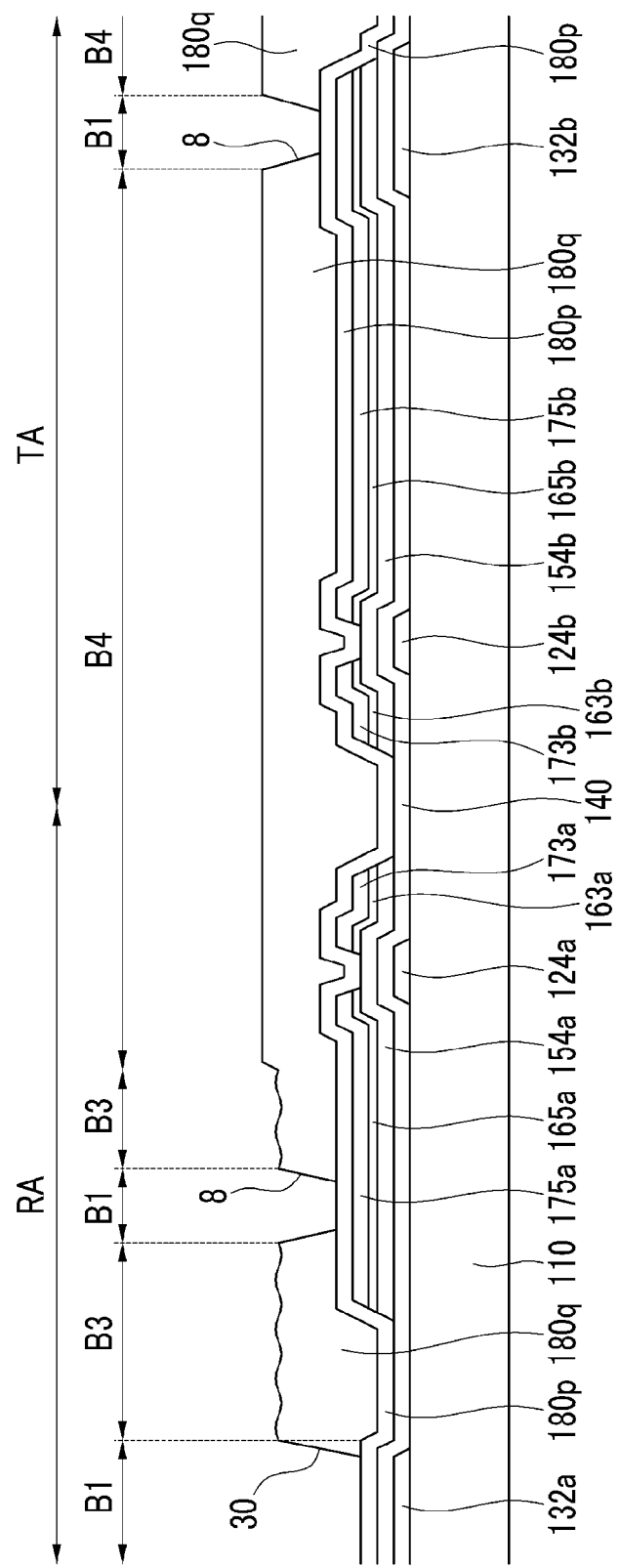
Figure 11:
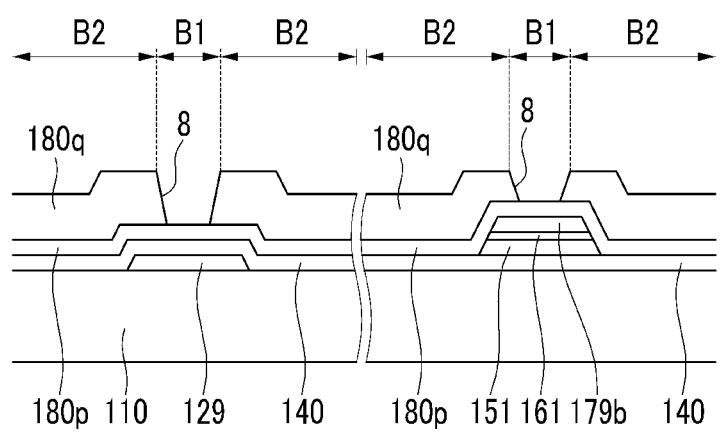

As shown in FIG. 10 and FIG. 11, a lower passivation layer 180p and an upper passivation layer 180q are formed on the substrate 110, after removing the remaining first photosensitive film PR1. The lower passivation layer 180p includes an inorganic material, such as silicon nitride, and the upper passivation layer 180q includes an organic material having photosensitivity.

The upper passivation layer 180q is exposed and developed to form a preliminary contact hole 8 and an opening 30, exposing the lower passivation layer 180p and overlapping the expansions 132a and 132b of the storage electrode. Here, a thickness of the upper passivation layer 180q is different in varying positions across the substrate 110, such as by using a mask having different transmittances depending on position on the substrate 110.

In detail, a portion of the upper passivation layer 180q corresponding to (e.g., overlapping) the preliminary contact hole 8 and the expansions 132a and 132b of the storage electrode, is referred to as a first transmittance region B1, a portion corresponding to (e.g., overlapping) a circumference (e.g., boundaries) of the ends 129 and 179b of the gate line and the data line (hereinafter referred to as "pad portion"), is referred to as a second transmittance region B2, a portion corresponding to a portion of the reflecting region RA is referred to as a third transmittance region B3, and a portion of the transmitting region TA and the reflecting region RA is referred to as a fourth transmittance region B4.

When the upper passivation layer 180q has positive photosensitivity, a light transmittance of the defined transmittance portions is satisfied with the condition of light transmittance of the first transmittance region B1>the second transmittance region B2>the third transmittance region B3>the fourth transmittance region B4 in the mask having different transmittances depending on position on the substrate 110 relative to the elements of the liquid crystal display disposed therein. When the upper passivation layer 180q has negative photosensitivity, the relative light transmittance of the defined transmittance portions is opposite to the condition of the mask having different transmittances depending on position on the substrate 110 for the positive photosensitivity described above.

As discussed above, where an exposure mask includes a transparent area, a light blocking area, and a semi-transparent area, the semi-transparent area may include a slit pattern, a lattice pattern, or a thin film having median transmittance or having a median thickness. When the slit pattern is used, the width of the slits or the space between the slits is preferably smaller than the resolution of a light exposer used for photolithography. The transmittance of the mask in various transmittance portions across the substrate may be controlled by using the semi-transparent layer and slits, the portion corresponding to the third transmittance region B3 may have the thinner thickness than the portion corresponding to the fourth transmittance region B4 by using the semi-transparent layer and the slits, and protrusions and depressions may be formed at the surface thereof as illustrated in FIG. 10.

In one exemplary embodiment, when the upper passivation layer 180q has positive photosensitivity, a mask having transmittance of the first transmittance region B1 of about 100%, transmittance of the second transmittance region B2 of about 60%, transmittance of the third transmittance region B3 of about 38%, and transmittance of the fourth transmittance region B4 of about 0% is provided. If the upper passivation layer 180q having an original thickness of 35,000 angstroms (Å) is exposed using the mask, the upper passivation layer 180q of the first transmittance region B1 is substantially all removed such that the lower passivation layer 180p is exposed, the upper passivation layer 180q of the second transmittance region B2 may have a thickness of about 15,000 Å, the upper passivation layer 180q of the third transmittance region B3 may have a thickness of about 25,000 Å, and the upper passivation layer 180q of the fourth transmittance region B4 may have a thickness of about 35,000 Å. The thicknesses of the various layers are taken substantially perpendicular to the substrate.

Figure 12:
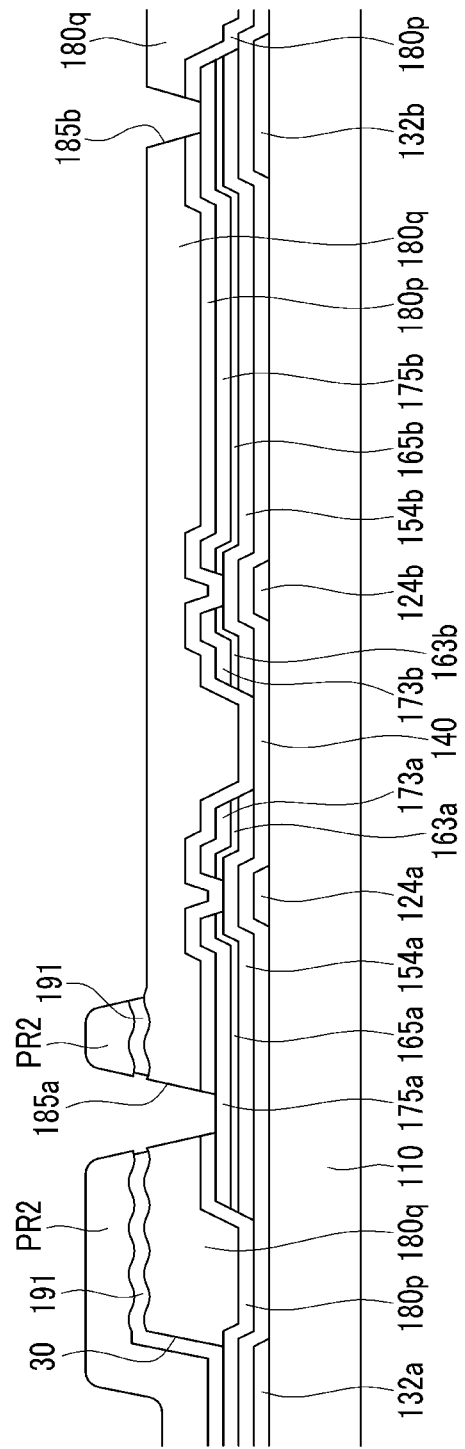
Figure 13:
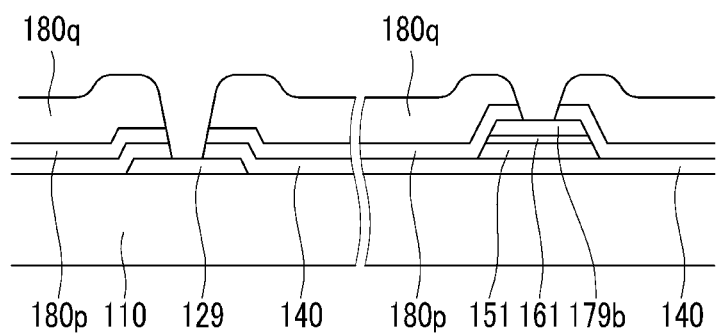

As shown in FIG. 12 and FIG. 13, a third metal layer is deposited on the upper passivation layer 180q, and a second photosensitive film PR2 is formed directly thereon.

The third metal layer is wet-etched by using the second photosensitive film PR2 as the etching mask to form a reflecting electrode 191. The third metal layer deposited in the preliminary contact hole 8 is removed such that surfaces of the lower passivation layer 180p are exposed through the preliminary contact hole 8. Also, the reflecting electrode 191 is electrically and physically connected with the lower passivation layer 180p overlapping the expansions 132a and 132b of the storage electrode, through the opening 30.

The third metal layer is over-etched, thereby forming an undercut in the third metal layer (reflecting electrode 191) under the second photosensitive film PR2, as illustrated in FIG. 12. In an exemplary embodiment, the undercut is formed within a size of about 3 micrometers (μm), taken in a direction substantially parallel to the substrate 110 and extending in from the preliminary contact hole 8.

Conventionally, the upper passivation layer and the metal layer are etched together (e.g., at substantially a same time or in a same single process), and the undercut is generated in the upper passivation layer under the metal layer due to an etching difference between the upper passivation layer and the metal layer, such that the phenomenon that the reflecting electrode lifts is generated. However, in an exemplary embodiment illustrated in FIG. 12, after the preliminary contact hole 8 is formed in the upper passivation layer 180q by exposure, if the reflecting electrode 191 is only wet-etched, the upper passivation layer 180q is over-etched such that the undercut is not generated in the upper passivation layer 180q under the reflecting electrode 191, and thereby the reflecting electrode does not lift. Therefore, the reflecting electrode 191 not exposed after forming the reflecting electrode 191, such that the surface of the reflecting electrode is not damaged in subsequent manufacturing processes In an exemplary embodiment of the invention, the third metal layer does not remain in the opening of the transmitting region TA, however, in an alternative exemplary embodiment, the metal layer may remain in the opening of the transmitting region TA.

Referring again to FIG. 12 and FIG. 13, the exposed lower passivation layer 180p is etched by using the second photosensitive film PR2 as an etching mask to form contact holes 185a and 185b exposing the drain electrodes 175a and 175b, respectively.

Here, the exposed upper passivation layer 180q (e.g. protruding from the undercut of the reflecting electrode 191) is partially removed along with the second photosensitive film PR2 such that the thickness of the second photosensitive film PR2 and the upper passivation layer 180q is reduced. Accordingly, a step of the upper passivation layer 180q between the transmitting region TA and the reflecting region RA may be reduced. Also, the thickness of the upper passivation layer 180q is reduced at the pad portion (e.g., the ends 129 and 179b of the gate line and the data line), such that the step between the pads and the upper passivation layer 180q is reduced. In an exemplary embodiment, a flowing thin film may be connected with the end portions 129 and 179b of the gate line and the data line without disconnection since the step between the pads and the upper passivation layer 180q is reduced.

In an exemplary embodiment of the invention, after forming the preliminary contact hole 8 (FIG. 10 and FIG. 11) in the upper passivation layer 180q, only the lower passivation layer 180p is etched such that the undercut is not formed in the lower passivation layer 180p. That is, the upper passivation layer 180q, disposed directly under and contacting the reflecting electrode 191, is not etched. Conventionally, when etching the upper passivation layer 180q and the lower passivation layer 180p together, the etching depths thereof are different such that the lower passivation layer 180p is over-etched and then the undercut may be generated in the lower passivation layer 180p. However, in the illustrated embodiment of the invention, the two passivation layers 180q and 180p are independently etched, such that the under-cut is not generated in the lower passivation layer 180p.

Also, while the lower passivation layer 180p is disposed separated from the reflecting electrode 191 and the etching of the lower passivation layer 180p is done independently, a surface of the reflecting electrode 191 is not exposed to the etching gas or the etchant, such that the surface of the reflecting electrode 191 is not damaged.

Returning to FIG. 2 and FIG. 3, after removing the second photosensitive film PR2, a transparent conductive layer such as ITO or IZO is formed on the substrate 110 and patterned to form a transmitting electrode 192 electrically and physically connected with the drain electrode 175b through the contact hole 185b, a connecting member 83 connecting the reflecting electrode 191 to the drain electrode 175a through the contact hole 185a, and contact assistants 81 and 82b connected to the end portions 129 and 179b of the gate line and the data line through the contact holes 181 and 182a.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a thin film transistor array panel, the method comprising:
    forming a gate line on a substrate;
    forming a storage electrode line on the substrate in the forming of a gate line;
    forming a gate insulating layer on the gate line;
    forming a semiconductor on the gate insulating layer;
    forming a first data line and a first drain electrode on the semiconductor;
    forming a lower passivation layer on the first data line and the first drain electrode;
    forming an upper passivation layer including protrusions and depressions, to define a preliminary contact hole and an opening separate from the preliminary contact hole in the upper passivation layer, wherein each of the preliminary contact hole and the opening exposes the lower passivation layer and overlaps the storage electrode line;
    forming a metal layer on the upper passivation layer;
    forming a photosensitive film on the metal layer;
    etching only the metal layer by using the photosensitive film as an etching mask to form a reflecting electrode, wherein the exposed lower passivation layer remains in the preliminary contact hole by the etching only the metal layer and the remaining exposed lower passivation layer is exposed through the preliminary contact hole by the etching only the metal layer;
    etching the exposed lower passivation layer remaining in the preliminary contact hole, after the etching only the metal layer, to form a first contact hole exposing the first drain electrode; and
    forming a connection assistance member connecting the first drain electrode and the reflecting electrode to each other through the first contact hole after removing the photosensitive film,
    wherein the reflecting electrode contacts the exposed lower passivation layer through the opening.

2. The method of claim 1, wherein after the forming of a metal layer,
    the upper passivation layer is disposed between the metal layer and the lower passivation layer; and
    the reflecting electrode is formed only by the etching of the metal layer.

3. The method of claim 1, wherein after the forming of a metal layer,
the upper passivation layer is disposed between the metal layer and the lower passivation layer, and
in the etching of the exposed lower passivation layer, the upper passivation layer is not etched and only the lower passivation layer is etched.

4. The method of claim 1, wherein
the etching of the metal layer includes wet-etching; and
the etching of the exposed lower passivation layer includes dry-etching.

5. The method of claim 4, wherein
the metal layer is over-etched in the etching of the metal layer, to form an undercut under the photosensitive film.

6. The method of claim 5, wherein
the under-cut is formed within a depth of 3 micrometers.

7. The method of claim 1, wherein the forming of an upper passivation layer includes:
coating a photosensitive organic layer on the lower passivation layer; and
exposing the photosensitive organic layer by using a photomask including a transmission region, a translucent region, and a light blocking region.

8. The method of claim 7, wherein
the translucent region of the photomask includes a semi-transparent layer including slits, and
the translucent region is disposed overlapping a portion of the substrate where the reflecting electrode is positioned, in the exposing of the photosensitive organic layer by using a photomask.

9. The method of claim 7, wherein
the translucent region of the photomask includes a first translucent region and a second translucent region having different light transmittance, and
in the exposing of the photosensitive organic layer by using the photomask, the first translucent region is disposed overlapping a portion of the substrate where the reflecting electrode will be formed, and the second translucent region is disposed overlapping edges of ends of the gate line or the data line.

10. The method of claim 1, wherein
a second data line and a second drain electrode are further formed in the forming of a first data line and a first drain electrode;
a second contact hole exposing the second drain electrode is formed in the forming of a first contact hole; and
a transmitting electrode connected to the second drain electrode through the second contact hole on the upper passivation layer is formed in the forming of a connection assistance member.

11. The method of claim 10, wherein
the forming of a semiconductor, the forming of a first and a second data line, and the forming of a first and second drain electrode includes using a photosensitive film pattern having different thicknesses depending on the positions of the substrate.

\* \* \* \* \*